US011776926B2

(12) United States Patent
Kirby et al.

(10) Patent No.: US 11,776,926 B2
(45) Date of Patent: *Oct. 3, 2023

(54) COMBINATION-BONDED DIE PAIR PACKAGING AND ASSOCIATED SYSTEMS AND METHODS

(71) Applicant: Micron Technology, Inc., Boise, ID (US)

(72) Inventors: Kyle K. Kirby, Eagle, ID (US); Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,487

(22) Filed: Feb. 17, 2022

(65) Prior Publication Data
US 2022/0246569 A1 Aug. 4, 2022

Related U.S. Application Data

(63) Continuation of application No. 17/035,579, filed on Sep. 28, 2020, now Pat. No. 11,289,440.

(51) Int. Cl.
*H01L 23/00* (2006.01)
*H01L 23/48* (2006.01)
(Continued)

(52) U.S. Cl.
CPC ............ *H01L 24/20* (2013.01); *H01L 23/481* (2013.01); *H01L 24/05* (2013.01); *H01L 24/19* (2013.01);
(Continued)

(58) Field of Classification Search
CPC ... H01L 24/20; H01L 23/481; H01L 25/0657; H01L 24/19; H01L 24/05; H01L 24/82; H01L 25/50; H01L 24/94; H01L 2224/214
See application file for complete search history.

(56) References Cited

U.S. PATENT DOCUMENTS 11,276,669 B2 * 3/2022 Yang .................. H01L 24/08
2009/0321947 A1 * 12/2009 Pratt .................. H01L 25/0657
438/109

(Continued)

FOREIGN PATENT DOCUMENTS

CN 110998844 A 4/2020
WO 2019079625 A1 4/2019

OTHER PUBLICATIONS

Office Action and Search Report dated Jul. 27, 2022 for Taiwanese Patent Application No. 110132842, 10 pages (with translation).
(Continued)

*Primary Examiner* — Mamadou L Diallo
(74) *Attorney, Agent, or Firm* — Perkins Coie LLP (57) ABSTRACT

Systems and methods for semiconductor devices having a substrate with bond pads, a die pair in a stacked configuration above the bond pads and having a first die having an oxide layer, a second die having an oxide layer attached to the first oxide layer, and conductive bonds electrically coupling the dies. Interconnects extend between the bond pads and the die pair, electrically coupling die pair to the substrate. The device may include a second die pair electrically coupled to: (1) the first die pair with secondary interconnects; and (2) the substrate with through-silicon vias extending through the first die pair. The top die of a die pair may be a thick die for use at the top of a pair stack. Pairs may be created by matching dies of a first silicon wafer to dies of a second silicon wafer, combination bonding the wafers, and dicing the die pairs.

13 Claims, 5 Drawing Sheets

(51) Int. Cl.
H01L 25/065 (2023.01)
H01L 25/00 (2006.01)
(52) U.S. Cl.
CPC .............. *H01L 24/82* (2013.01); *H01L 24/94* (2013.01); *H01L 25/0657* (2013.01); *H01L 25/50* (2013.01); *H01L 2224/214* (2013.01)

(56) References Cited

U.S. PATENT DOCUMENTS

| | | | |
|---|---|---|---|
| 2017/0162507 A1* | 6/2017 | Das | H01L 23/481 |
| 2018/0158749 A1* | 6/2018 | Yu | H01L 25/18 |
| 2018/0342475 A1* | 11/2018 | Wirz | H01L 24/03 |
| 2020/0135698 A1* | 4/2020 | Hong | H01L 21/6836 |
| 2021/0104495 A1* | 4/2021 | Vodrahalli | H01L 23/562 |
| 2021/0134820 A1* | 5/2021 | Huang | H01L 25/18 |

OTHER PUBLICATIONS

International Application No. PCT/US2021/048389—International Search Report and Written Opinion, dated Jan. 4, 2022, 14 pages.

* cited by examiner

COMBINATION-BONDED DIE PAIR PACKAGING AND ASSOCIATED SYSTEMS AND METHODS

CROSS-REFERENCE TO RELATED APPLICATION(S)

This application is a continuation of U.S. patent application Ser. No. 17/035,579, filed Sep. 28, 2020, now U.S. Pat. No. 11,289,440, which is incorporated herein by reference in its entirety.

TECHNICAL FIELD

The present disclosure is generally directed to semiconductor devices, and in several embodiments, more particularly to systems and methods of packaging with combination-bonded die pairs.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted.

The process of vertically stacking dies is referred to as three-dimensional integration (3DI) of a circuit, which generally uses through-silicon vias (TSV) and interconnects so that the 3DI circuit behaves as a single device to achieve performance improvements at reduced power. Interconnects (e.g., pillars) form electrical connections between each of the dies in a typical 3DI configuration. The gap created by the interconnects between each die limits the number of dies in a die stack based on overall height constraints.

DETAILED DESCRIPTION

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. In some embodiments, an individual semiconductor device may be "packaged" and include a molding material encasing the components and electrical connections in the device.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having combination-bonded die pairs. The die pairs are stackable using 3DI structures between stacks to form the semiconductor device. The die pairs are formed by wafer-to-wafer combination bonding before dicing. The wafers can be matched before bonding to maximize good die to good die pairs, where matching can be basic (e.g., match similar speed grade/quality), regional/zone (e.g., match similar zone yields), or die matching (e.g., match similar die yields), each improving overall package yield. The combination bond between the wafers includes an oxide-to-oxide bond to mechanically couple the wafers, and a metal-to-metal bond to electrically couple the wafers. The joined wafers are diced into die pairs before stacking using 3DI structures. Conventional semiconductor device packaging forms individual die stacks with 3DI interconnects between each die, which contribute to the overall height of the package and increase cost. The combination-bonded die pairs of the present technology have essentially zero bond-line between the pairs, reducing the overall stack height compared to individual dies stacked with 3DI structures between each die.

Figure 1A:
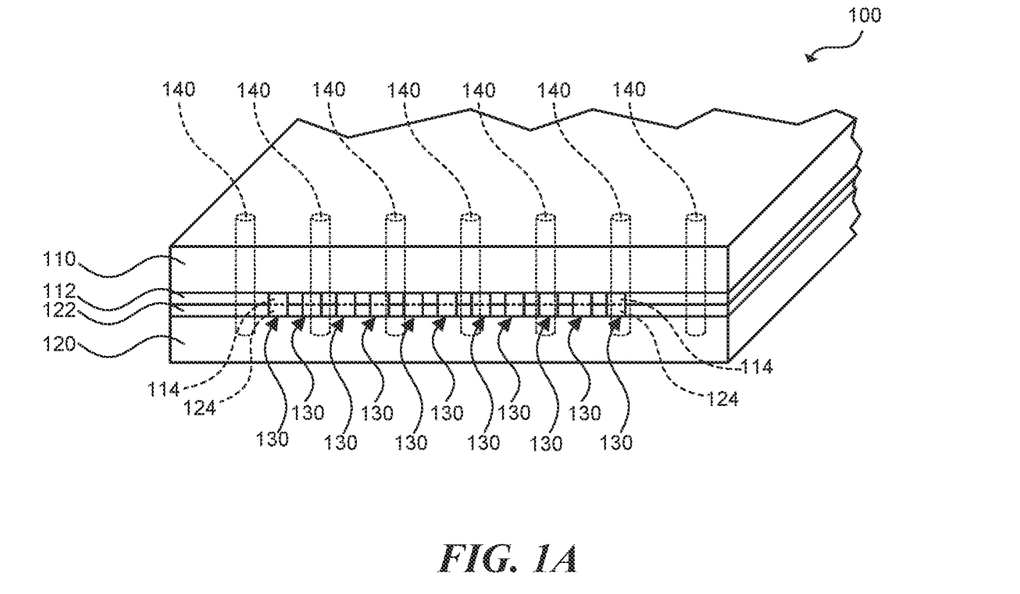
FIGS. 1A and 1B are perspective views showing a combination-bonded die pair having a thin top die with TSVs (FIG. 1A) and a thick top die without TSVs (FIG. 1B) in accordance with embodiments of the present technology.
Figure 1B:
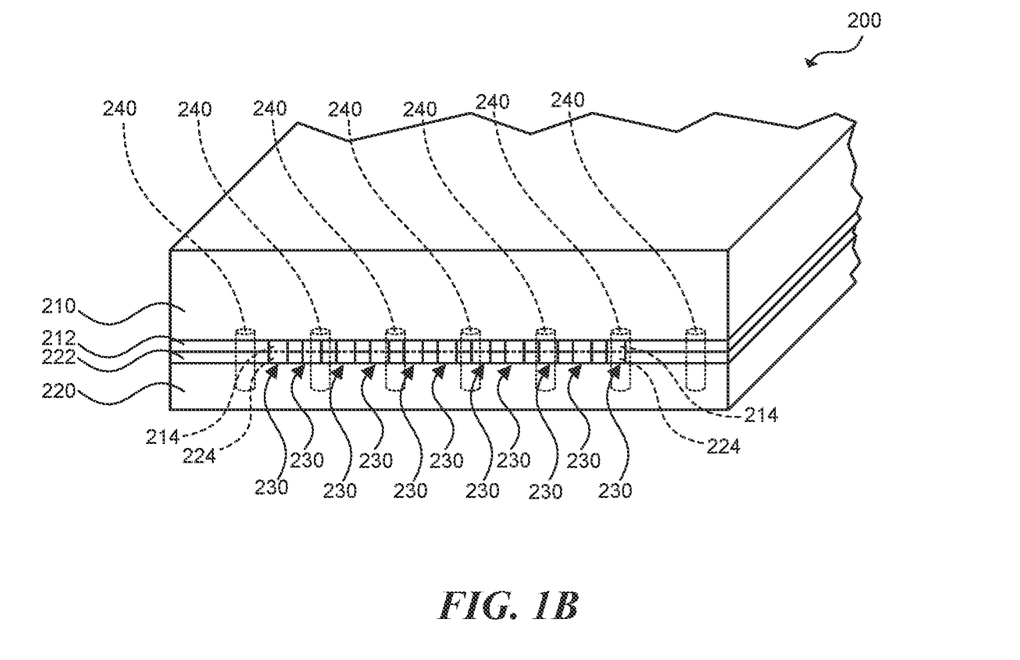

FIGS. 1A and 1B are perspective views showing embodiments of a combination-bonded die pair 100 having a thin top die with TSVs (FIG. 1A, "die pair 100"), and a combination-bonded die pair 200 having a thick top die without TSVs (FIG. 1B, "die pair 200"). Referring to FIG. 1A, the die pair 100 includes a first die 110 having a first oxide layer 112 and conductive features 114 in openings through the first oxide layer 112, and a second die 120 having a second oxide layer 122 and conductive features 124 in openings through the second oxide layer 122. The conductive features 114 can be bonded to the conductive features 124 to form conductive bonds 130 electrically coupling the first die 110 and the second die 120. In the die pair 100, the first die 110 is a thin top die, which is suitable for use as an intermediate die pair in a device die stack. The dies 110 and 120 are combination-bonded by bonding the first oxide layer 112 and the second oxide layer 122 together, and the conductive features 114 and 124 can be bonded together using metal-to-metal (e.g., copper pad-to-copper pad, etc.) bonding to create the conductive bonds 130. The oxide layers 112 and 122 can be native oxide layers or thermal oxide layers of the dies 110 and 120. In a stacked configuration, the die pair 100 can include TSVs 140 extending through the first die 110, the first oxide layer 112, the second oxide layer 122, and the second die 120 for conducting electrons from one side of the die pair 100 to the other side of the die pair 100. The die pair 100 typically has a large number of conductive bonds 130 and TSVs 140.

Referring to FIG. 1B, the die pair 200 includes a first die 210 having a first oxide layer 212 and conductive features 214 in openings through the first oxide layer 212, and a second die 220 having a second oxide layer 222 and conductive features 224 in openings through the second oxide layer 222. The conductive features 214 can be bonded to the conductive features 224 to form conductive bonds 230 electrically coupling the first die 210 and the second die 220. In the die pair 200, the first die 210 is a thick top die, which is suitable for use as the final die pair at the top of a device die stack. The dies 210 and 220 are combination-bonded by bonding the first oxide layer 212 and the second oxide layer 222 together, and the conductive features 214 and 224 can be bonded together using metal-to-metal (e.g., copper pad-to-copper pad, etc.) bonding to create the conductive bonds 230. The oxide layers 212 and 222 can be native oxide layers or thermal oxide layers of the dies 210 and 220. In a stacked configuration, the die pair 200 can include TSVs 240 extending from the first die 210 and through the first oxide layer 212, the second oxide layer 222, and the second die 220 for conducting electrons from the first die 210 to the opposite side of the second die 220. The die pair 200 typically has a large number of conductive bonds 230 and TSVs 240

Figure 2A:
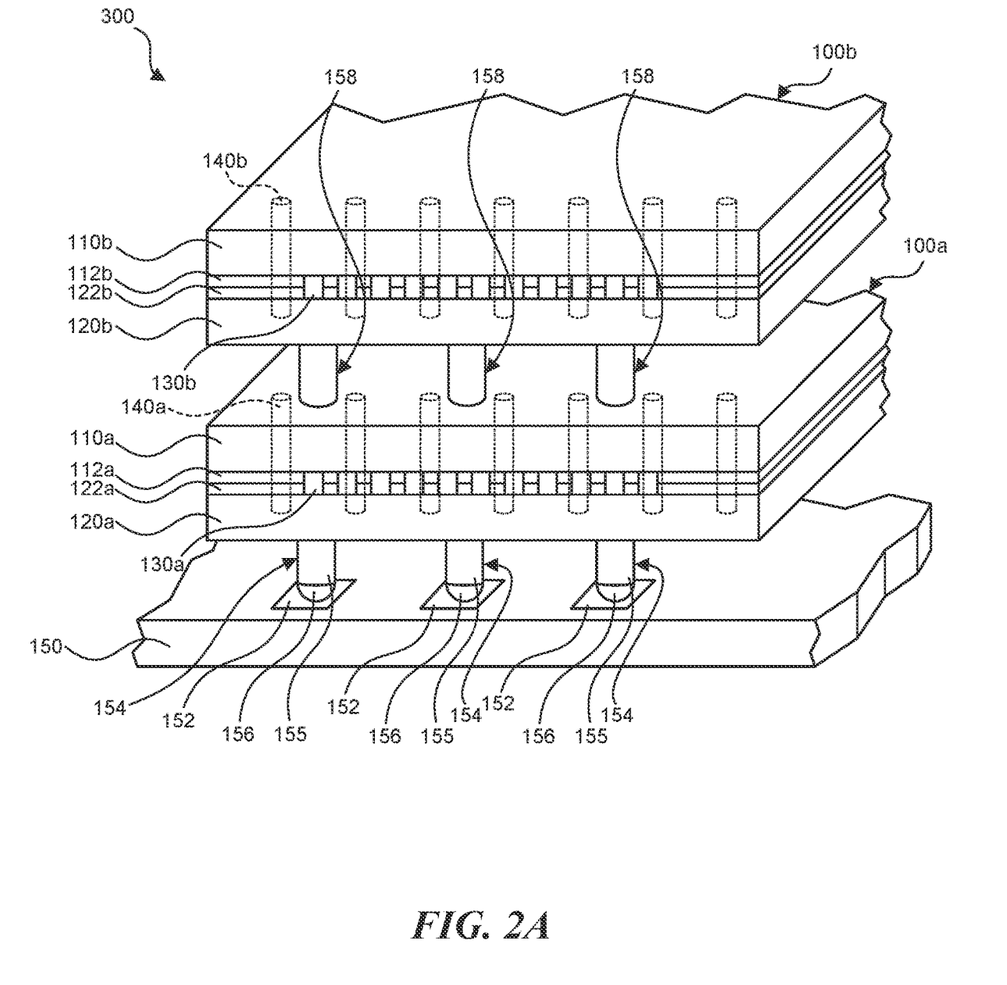
FIG. 2A is a perspective view showing a semiconductor device assembled with the combination-bonded die pairs of FIG. 1A.

FIG. 2A shows a perspective view of an embodiment of a semiconductor device ("device 300") assembled with the die pair 100, including a first die pair 100*a* and a second die pair 100*b*. The device 300 includes a substrate 150 having bond pads 152 electrically coupled to components of the device 300 using 3DI structures, such as primary interconnects 154 having pillars 155 electrically coupled to the first die pair 100*a* and solder caps 156 attached to the bond pads 152. The substrate 150 is accordingly electrically coupled through the primary interconnects 154 to the first die pair 100*a*, which includes a first die 110*a* having a first oxide layer 112*a*, a second die 120*a* having a second oxide layer 122*a*, and conductive bonds 130*a* electrically coupling the first die 110*a* and the second die 120*a*. TSVs 140*a* can form electrical connections from the substrate 150, through the first die pair 100*a*, and through secondary interconnects 158 (e.g., pillars and pads with solder caps, copper-to-copper, etc.) to the second die pair 100*b*, which is stacked on top of the first die pair 100*a*. The second die pair 100*b* includes a first die 110*b* having a first oxide layer 112*b*, a second die 120*b* having a second oxide layer 122*b*, and conductive bonds 130*b* electrically coupling the first die 110*b* and the second die 120*b*. TSVs 140*b* can form electrical connections from the substrate 150 and the first die pair 100*a* through the second die pair 100*b* for further stacking of the device 300.

Figure 2B:
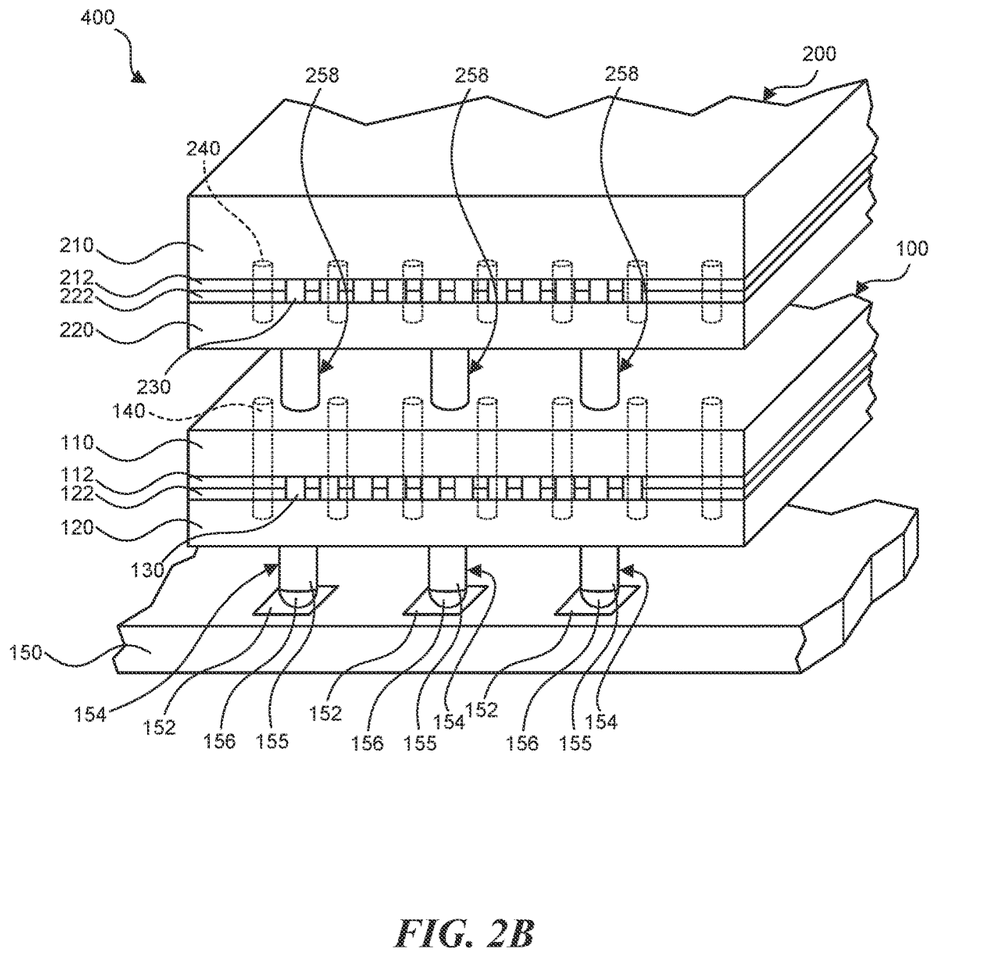
FIG. 2B is a perspective view showing a semiconductor device assembled with the combination-bonded die pair of FIG. 2A and the combination-bonded die pair of FIG. 2B, each in accordance with embodiments of the present technology.

FIG. 2B shows a perspective view of an embodiment of a semiconductor device ("device 400") assembled with the die pair 100 and the die pair 200. The device 400 includes the substrate 150 having bond pads 152 electrically coupled to components of the device 400 using 3DI structures, such as with primary interconnects 154 having pillars 155 with solder caps 156 electrically coupled to the bond pads 152. The substrate 150 is accordingly electrically coupled through the primary interconnects 154 to the die pair 100, which includes the first die 110 having the first oxide layer 112, the second die 120 having the second oxide layer 122, and the conductive bonds 130 electrically coupling the first die 110 and the second die 120. TSVs 140 can form electrical connections from the substrate 150, through the first die pair 100, and through secondary interconnects 258 to the die pair 200, which is stacked on top of the die pair 100 using 3D1 structures. The die pair 200 includes the first die 210 having the first oxide layer 212, the second die 220 having the second oxide layer 222, and the conductive bonds 230 electrically coupling the first die 210 and the second die 220. TSVs 240 can form electrical connections from the substrate 150 and the die pair 100 through the second die 220, the second oxide layer 222, and the first oxide layer 212 to the first die 210, which is a thick top die suitable for use as the final die at the top of the device 400.

Figure 2C:
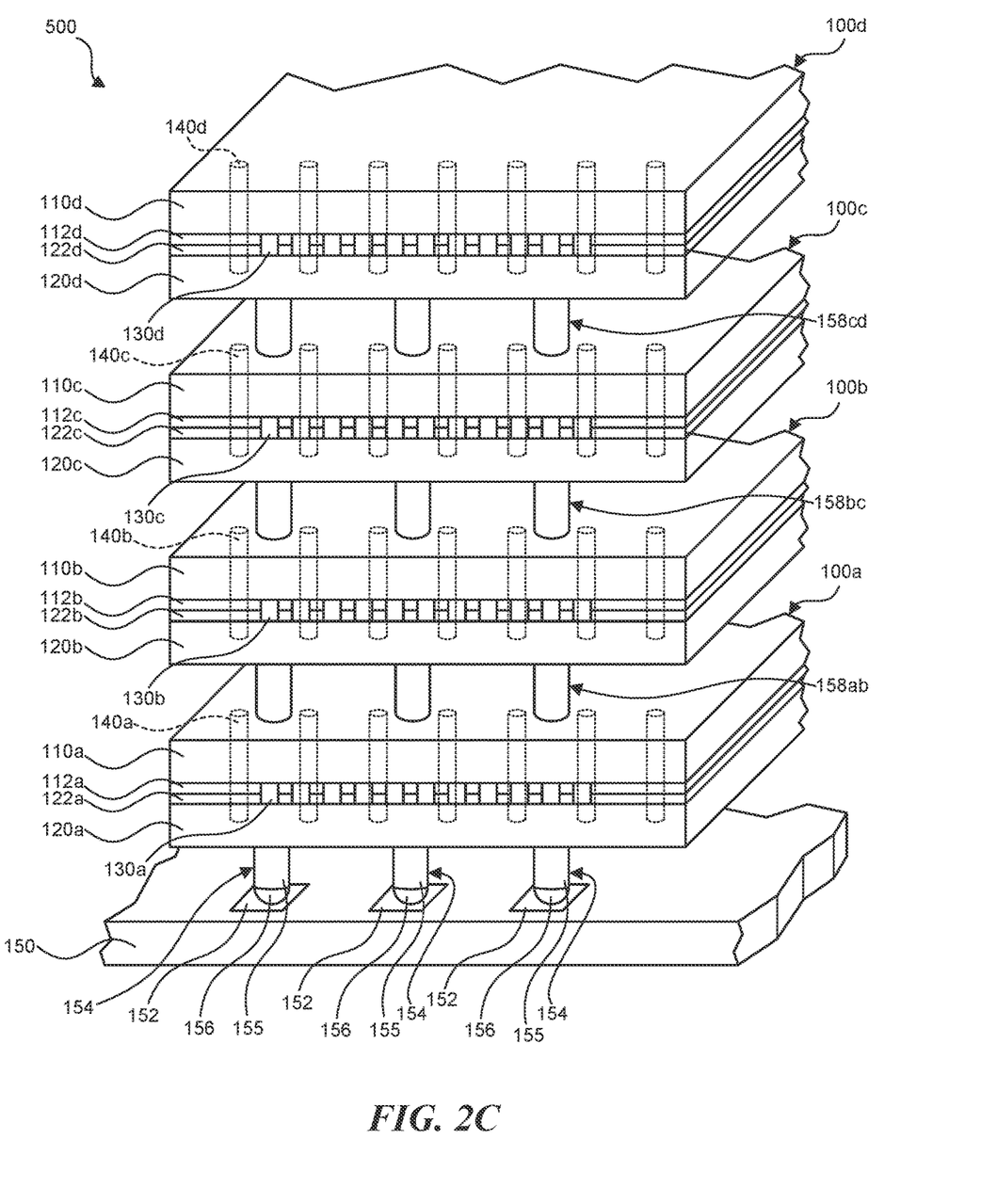
FIG. 2C is a perspective view showing a semiconductor device assembled with the combination-bonded die pair of FIG. 1A.

FIG. 2C shows a perspective view of an embodiment of a semiconductor device ("device 500") assembled with the die pair 100, including a first, second, third, and fourth die pairs 100*a-d* including first dies 110*a-d* having first oxide layers 112*a-d*, second dies 120*a-d* having second oxide layers 122*a-d*, and conductive bonds 130*a-d* electrically coupling the first dies 110*a-d* and the second dies 120*a-d*, respectively. The device 500 includes the substrate 150 having bond pads 152 configured to electrically couple to components of the device 500 using 3D1 structures, such as primary interconnects 154 having pillars 155 with solder caps 156 for coupling to the bond pads 152.

The substrate 150 is electrically coupled through the primary interconnects 154 to the first die pair 100*a*, which includes TSVs 140*a* to form electrical connections from the substrate 150, through the first die pair 100*a*, and through secondary interconnects 158*ab* to the second die pair 100*b*, which is stacked on top of the first die pair 100*a*. TSVs 140*b* can form electrical connections from the secondary interconnects 158*ab*, through the second die pair 100*b*, and through tertiary interconnects 158*bc* to the third die pair 100*c*, which is stacked on top of the first and second die pairs 100*a-b*. TSVs 140*c* can form electrical connections from the tertiary interconnects 158*bc*, through the third die pair 100*c*, and through quaternary interconnects 158*cd* to the fourth die pair 100*d*, which is stacked on top of the first, second, and third die pairs 100*a-c*. TSVs 140*d* can form electrical connections through the fourth die pair 100*d* for further stacking of the device 500. In other embodiments, a die pair with a thick top die (e.g., the die pair 200) can replace the fourth die pair in a configuration of the device 500, if the stack will only include four die pairs (e.g. die pairs 100*a-c* and the die pair 200 on the top as the fourth pair). Although four die pairs are shown in a stacked configuration, in other embodiments, any number of die pairs (e.g., five, six, seven, eight, or greater than eight pairs) are packaged with the substrate and are within the scope of the present technology.

The interconnects described herein may be formed from suitable conductive materials, such as copper (Cu), and may have solder caps to form the electrical connections (e.g., tin-silver (SnAg) solder caps). During assembly, the solder cap can be reflowed using gang reflow, sonic reflow, or other techniques. The bond pads can be copper pads and may be bonded using copper-to-copper bonding or other suitable techniques.

Figure 3:
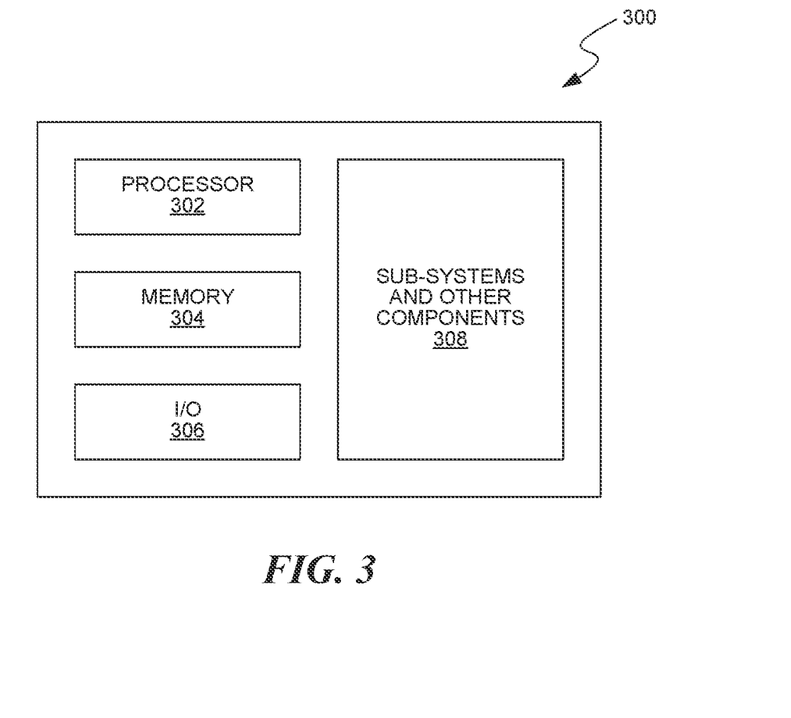
FIG. 3 is a schematic view of a system that includes a semiconductor device in accordance with embodiments of the present technology.

FIG. 3 is a block diagram illustrating a system that incorporates a semiconductor device in accordance with embodiments of the present technology. Any one of the semiconductor devices having the features described above with reference to FIGS. 1A-2C can be incorporated into any of a myriad of larger and/or more complex systems, a representative example of which is system 300 shown schematically in FIG. 3. The system 300 can include a processor 302, a memory 304 (e.g., SRAM, DRAM, flash, and/or other memory devices), input/output devices 306, and/or other subsystems or components 308. The semiconductor assemblies, devices, and device packages described above with reference to FIGS. 1A-2C can be included in any of the elements shown in FIG. 3. The resulting system 300 can be configured to perform any of a wide variety of suitable computing, processing, storage, sensing, imaging, and/or other functions. Accordingly, representative examples of the system 300 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 300 include lights, cameras, vehicles, etc. In these and other examples, the system 300 can be housed in a single unit or distributed over multiple interconnected units, e.g., through a communication network. The components of the system 300 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device, comprising:
a substrate comprising silicon and having substrate bond pads;
a first die pair in a stacked configuration above the bond pads, the first die pair comprising—
a first die having a first oxide layer with openings containing first conductive features; and
a second die having a second oxide layer with openings containing second conductive features, the second oxide layer attached to the first oxide layer and the first and second conductive features forming first conductive bonds electrically coupling the first die and the second die;
a second die pair in a stacked configuration above the first die pair, the second die pair comprising—
a third die having a third oxide layer with openings containing third conductive features; and
a fourth die having a fourth oxide layer with openings containing fourth conductive features, the fourth oxide layer attached to the third oxide layer and the third and fourth conductive features forming second conductive bonds electrically coupling the third die and the fourth die;
primary interconnects extending between the bond pads of the substrate and the second die;
first through-silicon vias extending through the second die electrically coupling the first conductive bonds between the first and second dies to the substrate through the primary interconnects and the bond pads;
second through-silicon vias extending through the first die pair; and
secondary interconnects extending between the first die pair and the second die pair electrically coupling the second die pair to the substrate through the second through-silicon vias, the primary interconnects, and the bond pads.

2. The semiconductor device of claim 1, further comprising a third die pair in a stacked configuration above the second die pair, the third die pair comprising—
a fifth die having a fifth oxide layer with openings containing fifth conductive features; and
a sixth die having a sixth oxide layer with openings containing sixth conductive features, the sixth oxide layer attached to the fifth oxide layer and the fifth and sixth conductive features forming third conductive bonds electrically coupling the fifth die and the sixth die;
third through-silicon vias extending through the second die pair; and
tertiary interconnects extending between the second die pair and the third die pair electrically coupling the third die pair to the substrate through the third through-silicon vias of the second die pair, the secondary interconnects, the second through-silicon vias of the first die pair, the primary interconnects, and the bond pads.

3. The semiconductor device of claim 2, further comprising a fourth die pair in a stacked configuration above the third die pair, the fourth die pair comprising—
a seventh die having a seventh oxide layer with openings containing seventh conductive features; and
an eighth die having an eighth oxide layer with openings containing eighth conductive features, the eighth oxide layer attached to the seventh oxide layer and the seventh and eighth conductive features forming fourth conductive bonds electrically coupling the seventh die and the eighth die;
fourth through-silicon vias extending through the third die pair; and
quaternary interconnects extending between the third die pair and the fourth die pair electrically coupling the fourth die pair to the substrate through the fourth through-silicon vias of the third die pair, the tertiary interconnects, the third through-silicon vias of the second die pair, the secondary interconnects, the second through-silicon vias of the first die pair, the primary interconnects, and the bond pads.

4. The semiconductor device of claim 1, wherein the first fourth die is a thick top die.

5. The semiconductor device of claim 1, wherein the third die is a thick top die, and wherein the semiconductor device further comprises secondary through-silicon vias extending through the fourth die to electrically couple the second conductive bonds and the secondary interconnects.

6. The semiconductor device of claim 2, wherein the fifth die is a thick top die, and wherein the semiconductor device further comprises tertiary through-silicon vias extending through the sixth die to electrically couple the third conductive bonds and the tertiary interconnects.

7. The semiconductor device of claim 3, wherein the seventh die is a thick top die, and wherein the semiconductor device further comprises quaternary through-silicon vias extending through the eighth die to electrically couple the fourth conductive bonds and the quaternary interconnects.

8. The semiconductor device of claim 1, where in the second oxide layer is directly attached to the first oxide layer.

9. A semiconductor device, comprising:
a first die pair comprising—
a first die having a first oxide layer with openings containing first conductive features; and
a second die having a second oxide layer with openings containing second conductive features, the second oxide layer attached directly to the first oxide layer and the first and second conductive features forming first conductive bonds electrically coupling the first die and the second die;
a second die pair in a stacked configuration with the first die pair, the second die pair comprising—
a third die having a third oxide layer with openings containing third conductive features; and
a fourth die having a fourth oxide layer with openings containing fourth conductive features, the fourth oxide layer attached directly to the third oxide layer and the third and fourth conductive features forming second conductive bonds electrically coupling the third die and the fourth die;
interconnects extending between the first die pair and the fourth die; and
through-silicon vias extending through the fourth die electrically coupling the second conductive bonds to the interconnects.

10. The semiconductor device of claim 9, wherein the interconnects are secondary interconnects and the through-silicon vias are second through-silicon vias, and wherein the semiconductor device further comprises:
a substrate comprising silicon and having substrate bond pads, the first and second die pairs in a stacked configuration above the bond pads;
primary interconnects extending between the bond pads of the substrate and the second die;
first through-silicon vias extending through the second die electrically coupling the first conductive bonds between the first and second dies to the substrate through the primary interconnects and the bond pads; and
third through-silicon vias extending through the first die pair,
wherein the second die pair is electrically coupled to the substrate through the second through-silicon vias, the secondary interconnects, the third through-silicon vias, the primary interconnects, and the bond pads.

11. The semiconductor device of claim 10, further comprising a third die pair in a stacked configuration above the second die pair, the third die pair comprising—
a fifth die having a fifth oxide layer with openings containing fifth conductive features;
a sixth die having a sixth oxide layer with openings containing sixth conductive features, the sixth oxide layer attached to the fifth oxide layer and the fifth and sixth conductive features forming third conductive bonds electrically coupling the fifth die and the sixth die;
fourth through-silicon vias extending through the second die pair; and
tertiary interconnects extending between the second die pair and the third die pair electrically coupling the third die pair to the substrate through the fourth through-silicon vias of the second die pair, the secondary interconnects, the third through-silicon vias of the first die pair, the primary interconnects, and the bond pads.

12. The semiconductor device of claim 9, wherein the third die is a thick top die.

13. The semiconductor device of claim 11, wherein the fifth die is a thick top die, and wherein the semiconductor device further comprises fifth through-silicon vias extending through the sixth die to electrically couple the third conductive bonds and the tertiary interconnects.

* * * * *